(12) United States Patent
Radisic et al.

(10) Patent No.: US 7,718,531 B2
(45) Date of Patent: May 18, 2010

(54) METHOD FOR FORMING CATALYST NANOPARTICLES FOR GROWING ELONGATED NANOSTRUCTURES

(75) Inventors: Aleksandar Radisic, Leuven (BE); Philippe M. Vereecken, Liège (BE)

(73) Assignee: IMEC, Leuven (BE)

( * ) Notice: Subject to any disclaimer, the term of this patent is extended or adjusted under 35 U.S.C. 154(b) by 163 days.

(21) Appl. No.: 12/146,885

(22) Filed: Jun. 26, 2008

(65) Prior Publication Data
US 2009/0072222 A1    Mar. 19, 2009

Related U.S. Application Data

(60) Provisional application No. 60/948,382, filed on Jul. 6, 2007.

(30) Foreign Application Priority Data
Oct. 16, 2007    (EP)    ................... 07075889

(51) Int. Cl.
H01L 21/44    (2006.01)
(52) U.S. Cl. ................... 438/678; 438/595; 438/669; 438/674; 257/E21.174; 257/E21.214; 257/E21.299
(58) Field of Classification Search ................ 438/288; 257/E21.159, E21.299, E21.31, E21.477, 257/E21.479
See application file for complete search history.

(56) References Cited

U.S. PATENT DOCUMENTS 6,515,339 B2    2/2003   Shin et al.
7,560,769 B2 *  7/2009   Sandhu et al. ............. 257/321
2005/0112052 A1 5/2005   Gu et al.
2005/0215049 A1 9/2005   Horibe et al.
2006/0290003 A1 12/2006  Kawabata et al.

OTHER PUBLICATIONS

Cao, A., et al. Direction-Selective and Length-Tunable In-Plane Growth of Carbon Nanotubes, Advanced Materials, vol. 15, No. 13, Jul. 4, 2003, pp. 1105-1109.
Lin, C.C., et al. Selective growth of horizontally-oriented carbon nanotube bridges on patterned silicon wafers by electroless plating Ni catalysts, Diamond and Related Materials, vol. 14, No. 11-12, pp. 1867-1871, Sep. 28, 2005.
Yung Joon Jung, et al. High-Density, Large-Area Single-Walled Carbon Nanotube Networks on Nanoscale Patterned Substrates, J. Phys. Chem. B, vol. 107, 2003, pp. 6859-6864.

(Continued)

Primary Examiner—Charles D Garber
Assistant Examiner—Cheung Lee
(74) Attorney, Agent, or Firm—Knobbe Martens Olson & Bear LLP

(57) ABSTRACT

Preferred embodiments provide a method for forming at least one catalyst nanoparticle on at least one sidewall of a three-dimensional structure on a main surface of a substrate, the main surface lying in a plane and the sidewall of the three-dimensional structure lying in a plane substantially perpendicular to the plane of the main surface of the substrate. The method comprises obtaining a three-dimensional structure on the main surface, the three-dimensional structure comprising catalyst nanoparticles embedded in a non-catalytic matrix and selectively removing at least part of the non-catalytic matrix at the sidewalls of the three-dimensional structure to thereby expose at least one catalyst nanoparticle.

21 Claims, 5 Drawing Sheets

OTHER PUBLICATIONS

Cao et al., Advanced Materials, vol. 15, No. 13, p. 1105, 2003.
Shi et al., Applied Physics Letters, 89, 083105, 2006.
Franklin et al., Advanced Materials, vol. 12, No. 12, p. 890, 2000.
Landolt et al., "Electrochemical and Materials Science Aspects of Alloy Deposition", Electrochimica Acta, vol. 39, No. 8/9, 1075-1090, 1994.

* cited by examiner

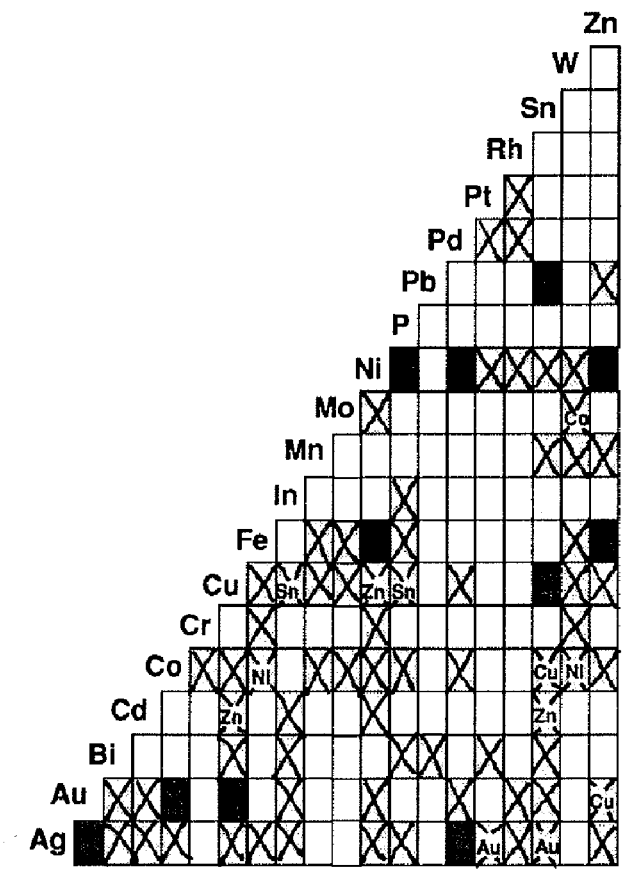
FIG. 2 – PRIOR ART
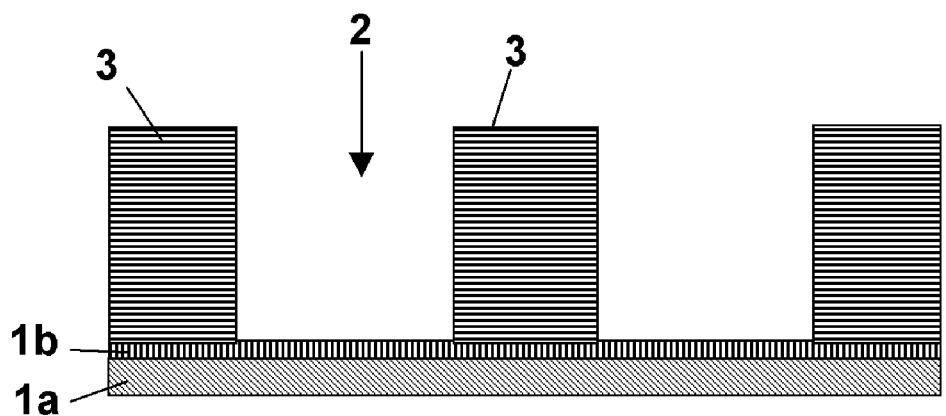
FIG. 3A

METHOD FOR FORMING CATALYST NANOPARTICLES FOR GROWING ELONGATED NANOSTRUCTURES

CROSS-REFERENCE TO RELATED APPLICATIONS

This application claims the benefit under 35 U.S.C. §119 (e) of U.S. Provisional Application No. U.S. 60/948,382 filed on Jul. 6, 2007, and claims the benefit under 35 U.S.C. §119 (a)-(d) of European Application No. 07075889.1 filed on Oct. 16, 2007, the disclosures of which are hereby expressly incorporated by reference in their entirety and are hereby expressly made a portion of this application.

FIELD OF THE INVENTION

Methods for formation of catalyst nanoparticles are provided. More particularly, a method for providing at least one catalyst nanoparticle on at least one sidewall of a three-dimensional structure is provided. A method for forming at least one elongated nanostructure on at least one sidewall of a three-dimensional structure using such a catalyst nanoparticle as a catalyst is also provided.

BACKGROUND OF THE INVENTION

Nanostructures such as Nanowires (NWs) and Carbon Nanotubes (CNTs) have been identified as one of the most promising candidates to extend and even replace materials currently used in microelectronic manufacturing processes. For example, metallic CNTs have been proposed as nanoelectronic interconnects due to their high current carrying capacity, whereas semiconducting CNTs have been indicated as nanoscale transistor elements due to their large range band gap. These and similar applications cannot be fully accomplished yet since the fabrication of nanostructures still faces a variety of unsolved issues, which vary from one application to another but may, however, be similar in some aspects.

A first issue is related to the growth of nanostructures in a direction substantially parallel to a main surface of a substrate, i.e. in a direction, when the main surface of the substrate is lying in a plane, substantially parallel to the plane of the main substrate.

It would be advantageous to form catalytic nanoparticles on sidewalls of e.g. vias and/or trenches and/or any desired three-dimensional structure, and then grow nanostructures directly from these catalytic nanoparticles and thus having e.g. CNT "interconnects" already in place, instead of going through a difficult task of placing them in the desired position in a separate step. In prior art methods, placement of catalyst particles on sidewalls of three-dimensional structures is described using physical vapor deposition or chemical vapor deposition (PVD or CVD) techniques. The samples on which CNTs have to be grown are therefore placed in a reactor such that CNTs grow parallel to the wafer surface.

In "Advanced Materials, Vol. 15, No. 13, page 1105, 2003", Cao et al. describe direction-selective in-plane growth of CNTs between pre-patterned electrodes using chemical vapor deposition techniques. This technique is however based on a shadowing effect and deposition occurs only on sidewalls which all face the same direction. Hence, with this method, CNTs can only be grown into one, predetermined direction. Hence, this technique is not suitable for, for example, interconnect applications where the connections need to go in all possible directions in a plane substantially parallel to a main surface of a substrate.

In "Applied Physics Letters, 89, 083105, 2006", Shi et al. describe direct synthesis of single-walled CNTs by bridging metal electrodes by laser-assisted chemical vapor deposition (LCVD). However, this synthesis is very localized and restricted by the size of a laser spot used. By using this technique, only a few CNTs are created across the electrodes (FIG. 2 in this document only shows two CNTs formed on the substrate). Forming more CNTs, or in other words providing a higher density of CNTs on the substrate would be very cost-and time-ineffective because for this purpose the laser spot would have to be moved over the whole surface of the substrate. This technique is thus not well suited to obtain a high density of CNTs or NWs, e.g. a density of higher than $10^{12}$ $cm^{-2}$, needed for interconnect applications. The technique is therefore not suitable for being used for mass production of CNTs.

Another issue is that the existing methods of manufacturing the above-mentioned nanostructures are not particularly compatible with standard, existing semiconductor processing techniques.

In "Advanced Materials, Vol. 12, No. 12, page 890, 2000", Franklin et al. describe an enhanced CVD approach for extensive nanotube networks with directionality. With directionality is meant here, growing nanotubes having their longitudinal axis in a predetermined direction. However, in this approach use is made of silicon towers that are 10 μm high and it is difficult to make the method compatible with or to incorporate it in state of the art semiconductor processing.

Despite the improvements achieved up till now, selective placement of catalytic nanoparticles onto sidewalls of three-dimensional structures remains critical to obtain subsequent growth of nanostructures which may be oriented parallel to the substrate. Up till now no methods exists in such a way that they are scalable and fully compatible with existing semiconductor processing in an economical attractive and realistic way.

SUMMARY OF THE INVENTION

A good method for providing at least one catalyst nanoparticle on at least one sidewall of a three-dimensional structure on a substrate and a good method for forming elongated nanostructures using such catalyst nanoparticles as a catalyst is provided. This is accomplished by methods and devices according to preferred embodiments.

The methods according to preferred embodiments are scalable and fully compatible with existing semiconductor processing.

Furthermore, methods according to preferred embodiments can allow the growth of elongated nanostructures such as CNTs with control over the diameter, number, density and length of the elongated nanostructures.

The methods according to preferred embodiments provide a way for placing catalytic nanoparticles on sidewalls of a three-dimensional structure and hence provide an alternative for state of the art techniques such as sputtering nanoparticles onto the sidewalls of existing three-dimensional structures, which may be difficult for e.g. narrow interconnect structures.

In a first aspect, a method is provided for providing at least one catalyst nanoparticle on at least one sidewall of a three-dimensional structure on a main surface of a substrate, the main surface lying in a plane and the sidewall of the three-dimensional structure lying in a plane substantially perpendicular to the plane of the main surface of the substrate. The method comprises:

obtaining a three-dimensional structure on the main surface of the substrate, the three-dimensional structure comprising catalyst nanoparticles embedded in a non-catalytic matrix, and selectively removing at least part of the non-catalytic matrix at the sidewalls of the three-dimensional structure, to thereby expose at least one catalyst nanoparticle.

Selectively removing at least part of the non-catalytic matrix at the sidewalls may be performed using wet etching and/or dry etching techniques.

Obtaining a three-dimensional structure may be performed by:

providing a sacrificial pattern on the main surface of the substrate, the sacrificial pattern comprising at least one opening, filling the at least one opening with a material comprising a non-catalytic matrix with embedded therein catalyst nanoparticles, and removing the sacrificial pattern to form the three-dimensional structure.

Removing the sacrificial pattern may be done by wet etching or dry etching techniques.

Filling the at least one opening with a material comprising a non-catalytic matrix with embedded therein catalyst nanoparticles may comprise:

filling the at least one opening with a material comprising a non-catalytic matrix with embedded therein a catalytic material, and performing an annealing step to form the catalyst nanoparticles.

The catalytic material embedded in a non-catalytic conductive matrix may be an alloy, for example may be an alloy of cobalt (Co) embedded in a copper (Cu) matrix.

The annealing step may be performed by a Rapid Thermal Anneal at a temperature between 350° C. and 900° C.

Filling the at least one opening in the sacrificial pattern with a material comprising a non-catalytic matrix with embedded therein a catalytic material may be performed by co-deposition techniques. According to preferred embodiments, the co-deposition technique may comprise alloy co-deposition in which both the catalytic material, e.g. metal, and non-catalytic material, e.g. metal, may be deposited from dissolved metal ions in an electrolyte. According to other preferred embodiments, the co-deposition technique may comprise particle co-deposition in which catalytic nanoparticles are dispersed as metallic particles in a solution and the matrix is deposited from dissolved metal ions in the solution. For example, a suitable solution may comprise Co nanoparticles in a cupric sulphate solution.

Filling the at least one opening with a material comprising a non-catalytic matrix with embedded therein a catalytic material may be performed by electrochemical deposition or by electroless deposition from a same electrolytic bath.

Providing a sacrificial pattern may be performed by:

providing a layer of sacrificial material, for example a layer of an organic material, onto the main surface of the substrate, and forming at least one opening in the layer of sacrificial material according to a predetermined pattern, thereby exposing a part of the main surface of the substrate.

Forming at least one opening may be performed by patterning the sacrificial layer using photolithography and an anisotropic dry etch process to transfer the predetermined pattern to the sacrificial layer.

According to preferred embodiments the method may furthermore comprise providing a capping layer on top of the non-catalytic matrix before selectively removing at least part of the non-catalytic matrix at the sidewalls of the three-dimensional structure. The capping layer may be for preventing elongated nanostructure to be grown on the top of the three-dimensional structures.

According to preferred embodiments, the substrate may comprise a carrier, which may, for example be a semiconductor wafer, and a seed layer for initiating electrochemical deposition or electroless deposition. The seed layer may, for example, be a continuous or discontinuous layer comprising WCN or Cu or may, according to other embodiments, be a continuous or discontinuous layer comprising Pd, Pt and/or Ru particles.

According to preferred embodiments, the method may furthermore comprise, after removing the sacrificial pattern, removing exposed parts of the seed layer.

In a further aspect, a method is provided for forming at least one elongated nanostructure on at least one sidewall of a three-dimensional structure on a main surface of a substrate, the main surface lying in a plane and the sidewall of the three-dimensional structure lying in a plane substantially perpendicular to the plane of the main surface of the substrate. The method comprises:

obtaining a three-dimensional structure on the main surface, the three-dimensional structure comprising catalyst nanoparticles embedded in a non-catalytic matrix, selectively removing at least part of the non-catalytic matrix at the sidewalls of the three-dimensional structure to thereby expose at least one catalyst nanoparticle, and growing at least one elongated nanostructure using the at least one exposed catalyst nanoparticle as a catalyst.

Growing at least one elongated nanostructure may be performed such that the at least one elongated nanostructure lies in a plane substantially parallel to the plane of the main surface of the substrate.

Growing at least one elongated nanostructure may be performed by chemical vapor deposition, Vapor Liquid Solid or Vapor Solid Solid.

According to preferred embodiments, the elongated nanostructure may be a carbon nanotube (CNT), and growing the CNT may be performed by chemical vapor deposition using a carbon source.

According to preferred embodiments, the method may furthermore comprise providing a capping layer on top of the non-catalytic matrix before selectively removing at least part of the non-catalytic matrix at the sidewalls of the three-dimensional structure. The capping layer may be for preventing elongated nanostructure to be grown on the top of the three-dimensional structures.

In a further aspect, a three-dimensional structure on a main surface of a substrate is provided, the three-dimensional structure comprising at least one elongated nanostructure on at least one sidewall thereof, the three-dimensional structure being obtained by a method according to embodiments of preferred embodiments.

According to further aspects, the use of the methods according to preferred embodiments in the manufacturing process of semiconductor devices is provided.

According to further aspects the use of the methods according to preferred embodiments in the formation of interconnects in a semiconductor device is provided.

In yet a further aspect, a semiconductor device comprising at least one three-dimensional structure on a main surface of a substrate, the main surface lying in a plane is provided. The semiconductor device furthermore comprises at least one elongated nanostructure formed on at least one sidewall of the semiconductor device, the at least one elongated nanostructure lying in a plane substantially parallel to the plane of the main surface of the substrate and being formed by the methods according to preferred embodiments.

According to preferred embodiments, a method is provided for forming catalytic nanoparticles (catalysts) on at least one of the sidewalls of a vertical (3D) structure. The method according to this embodiment comprises at least the steps of:
  First providing a substrate with a sacrificial layer on top of the substrate, and
  Providing a sacrificial pattern having openings on the substrate and exposing the top surface of the substrate at the bottom of the openings, and
  At least partially filling the openings with catalytic material embedded in a non-catalytic matrix, and
  Providing a capping layer onto the non-catalytic matrix comprising catalytic material, and
  Removing the sacrificial layer to expose the sidewalls of the non-catalytic matrix to form the vertical (3D) structure, and
  Optionally, annealing the substrate such that the catalytic material is converted into catalytic nanoparticles, and
  Selectively etching (partly removing) the non-catalytic material on the sidewalls of the vertical (3D) structure to expose the nanoparticles.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages according to preferred embodiments will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

All figures/drawings are intended to illustrate some aspects and preferred embodiments. Devices are depicted in a simplified way for reason of clarity. Not all alternatives and options are shown and therefore the invention is not limited to the content of the given drawings. Like numerals are employed to reference like parts in the different figures.

FIG. 2 illustrates suitable combinations for binary and ternary alloys which can be taken into account to perform co-deposition of catalytic material embedded in a non-catalytic matrix using electrodeposition (from D. Landolt et al. "Electrochemical and Materials Science Aspects of Alloy Deposition", Electrochimica Acta, Vol. 39, No. 8/9, 1075-1090, 1994).

FIGS. 3A to 3E illustrate subsequent steps in a method according to preferred embodiments.

Figure 1A:
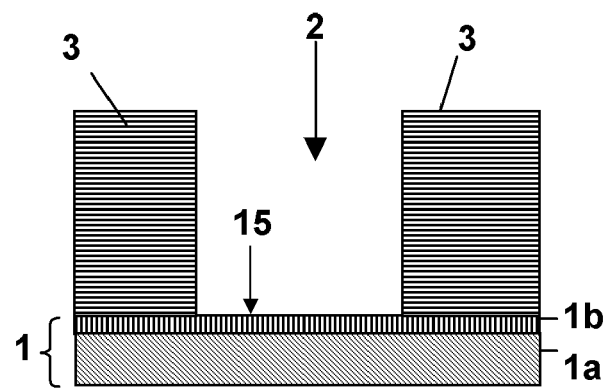
FIGS. 1A to 1F illustrate subsequent steps in a method according to preferred embodiments.

In the different figures, the same reference signs refer to the same or analogous elements.

DETAILED DESCRIPTION OF THE PREFERRED EMBODIMENT

The following description and examples illustrate various preferred embodiments. It will be appreciated that there are numerous variations and modifications of these embodiments that are possible. Accordingly, the descriptions of the various embodiments should not be deemed to limit the scope of the invention, which is defined by the claims.

The terms top, bottom and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that the only relevant components of the device are A and B.

It should be appreciated that in the description of exemplary preferred embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

Preferred embodiments relates to a method for providing at least one catalyst nanoparticle on at least one sidewall of a three dimensional structure on a main surface of a substrate. The invention furthermore provides a method for forming at least one elongated nanostructure using the at least one nanoparticle as a catalyst.

According to preferred embodiments, a method is provided for providing at least one catalyst nanoparticle on at least one sidewall of a three-dimensional structure on a main surface of a substrate, the main surface lying in a plane and the sidewall of the three-dimensional structure lying in a plane substantially perpendicular to the plane of the main surface of the substrate.

The method comprises:
- obtaining a three-dimensional structure on the main surface of the substrate, the three-dimensional structure comprising catalyst nanoparticles embedded in a non-catalytic matrix, and
- selectively removing at least part of the non-catalytic matrix at the sidewalls of the three-dimensional structure to thereby expose at least one catalyst nanoparticle.

Catalyst nanoparticles formed by the method according to preferred embodiments may advantageously be used as a catalyst for growing substantially parallel nanostructures at the at least one sidewall of the three-dimensional structures. These catalyst nanoparticles, which can be located at predetermined locations, e.g. at the sidewalls, can catalyse the nucleation and growth of elongated nanostructures, such as e.g. carbon nanotubes (CNTs) or nanowires (NWs), using growth techniques such as Chemical Vapor Deposition (CVD), Vapor Liquid Solid (VLS) or Vapor Solid Solid (VSS) techniques. With predetermined locations is meant here that, when so required, elongated nanostructures 9 can be formed only on the sidewalls 10 of the three-dimensional structures and nowhere else on the three-dimensional structure.

The method for providing at least one catalyst nanoparticle on at least one sidewall of a three-dimensional structure on a substrate and the method for forming substantially parallel elongated nanostructures on a substrate according to preferred embodiments can be used with any size of substrate and are fully compatible with semiconductor processing technology.

The following terms are provided solely to aid in the understanding of the preferred embodiments.

With the term elongated nanostructures is meant any two-dimensionally confined pieces of solid material in the form of wires (nanowires), tubes (nanotubes), rods (nanorods) and similar elongated substantially cylindrical or polygonal nanostructures having a longitudinal axis. A cross-dimension of the elongated nanostructures preferably lies in the region of 1 to 500 nanometers.

According to preferred embodiments, organic elongated nanostructures, such as e.g. carbon nanotubes (CNTs), or inorganic elongated nanostructures, such as e.g. semiconducting nanowires (e.g. silicon nanowires) may be used.

According to preferred embodiments, the term "base growth" of elongated nanostructures, such as e.g. CNTs or NWs, as used in this application refers to growth having the catalyst nanoparticle attached to the substrate. The term "tip growth" as used in this application refers to growth having the elongated nanostructures, such as e.g. CNTs or NWs, attached to a surface and the nanoparticle being on top of the elongated nanostructures, such as e.g. CNTs or NWs.

The term "catalyst nanoparticles" refers to "active" catalyst nanoparticles which are suitable to be used as a catalyst for growth of elongated nanostructures, e.g. CNTs or NWs. In other words, "active" is to be understood as being capable of initiate growth/synthetization/creation of an elongated nanostructure, e.g. a CNT or NW. In the description, whenever the terms catalyst nanoparticle or catalytic nanoparticle are used, it has to be understood that the same thing is meant, i.e. a nanoparticle that has properties to initiate the growth of elongated nanostructures such as CNTs or NWs.

According to preferred embodiments the term "co-deposition" means that two or more elements or particles are deposited at a same time, e.g. from a same bath, to respectively form an alloy or a composite. Different aspects and types of "co-deposition" are known in state of the art and described e.g. by Brenner et al. in "Electrodeposition of Alloys", Academic Press, New York, 1963.

According to preferred embodiments, the term "substrate" may include any underlying material or "carrier" that may be used, or upon which a device, a circuit or an epitaxial layer may be formed. According to preferred embodiments, the "substrate" may comprise a carrier with a seed layer such as e.g. a WCN layer provided thereon. This seed layer acts as an electrode for subsequent electrochemical deposition (ECD) or for electroless deposition, also referred to as respectively electrochemical or electroless plating (see further). With "electrochemical deposition" or "plating" is meant an electrochemical process where an external electrical signal, e.g. current or voltage, is applied for reduction of metal ions. With "electroless deposition" or "electroless plating" is meant an electrochemical process where a chemical reducing agent is used for reduction of the metal ions (and no external electrical signal such as current or voltage is applied). Examples of suitable carrier materials onto which seed layer material can be deposited are for example silicon, doped silicon, gallium arsenide (GaAs), gallium phosphide (GaP), gallium arsenide phosphide (GaAsP), indium phosphide (InP), germanium (Ge) or silicon germanium (SiGe). According to alternative embodiments, the "carrier" may further include an insulating layer such as a $SiO_2$ or an $Si_3N_4$ layer underneath the seed layer. According to further embodiments, the substrate may be a substrate which itself has seed layer properties to initiate ECD or electroless deposition.

Subsequent steps in a method according to preferred embodiments are schematically illustrated in FIGS. 1A to 1F. It has to be understood that this is only for the ease of explanation and that this is not intended to limit the invention in any way. The method may also comprise more or fewer steps or may comprise a different sequence of steps.

In a first step, a substrate 1 is provided. According to preferred embodiments, the substrate 1 should be such that it acts as a seed layer to initiate ECD or electroless deposition. Therefore, according to preferred embodiments, the substrate 1 may comprise a carrier 1a with at least one seed layer 1b provided thereon (see FIG. 1A). The at least one seed layer 1b can be a continuous or discontinuous layer. For example, in case of ECD deposition the substrate 1 may be formed of a carrier 1a onto which at least on seed layer 1b, for example a WCN layer, a Co layer or a copper layer, is provided such that a main surface of the substrate 1 can initiate ECD. In case of ECD deposition at least one of the at least one seed layer 1b should be continuous. For example, according to a specific example, two seed layers 1b may be provided onto the carrier 1a. Therefore, for example, first a continuous WCN layer may be deposited followed by the deposition of a discontinuous Co layer. According to other embodiments, in case of electroless deposition, the substrate 1 may, for example, comprise a discontinuous deposited seed layer 1b comprising particles such as Pd, Pt or Ru to initiate electroless plating. In both cases, i.e. in case of ECD and electroless deposition, the carrier 1a may, for example, be e.g. a Si wafer or a $Si/SiO_2$ wafer.

Alternatively, the substrate 1 may be formed of a bulk material which itself may have seed layer properties to initiate ECD or electroless deposition. In this case, additional provision of a seed layer 1b may not be necessary but may, nevertheless, in some embodiments still be provided.

Onto the substrate 1, a three-dimensional structure is formed. This may be accomplished by first providing a sacrificial pattern 3 onto the substrate 1. The sacrificial pattern 3 may comprise at least one opening or hole 2. According to preferred embodiments, the step of providing a sacrificial pattern 3 may be performed by first depositing a sacrificial layer and subsequently patterning at least one opening 2 in the sacrificial layer to form the sacrificial pattern 3 (see FIG. 1A). The openings 2 in the sacrificial layer may be formed using standard semiconductor processes, such as e.g. a combination of lithography and dry etching, e.g. anisotropic dry etching. Standard lithographic processing may at least comprise depositing at least one photosensitive layer, for example a photoresist layer, and optionally an antireflective coating on top of or underneath the sacrificial layer and developing the at least one photosensitive layer to create a photolithographic pattern. In case an antireflective coating is provided on top of the sacrificial layer, this coating may be so as to be easily removable during the lithography processing. The photolithographic pattern may then be used as a mask in e.g. reactive ion etching to form openings 2 in the sacrificial layer, thereby exposing parts of a main surface 15 of the substrate 1. According to preferred embodiments, the sacrificial layer can be a $SiO_2$ layer which may, for example, be formed by Chemical Vapor Deposition (CVD). According to other preferred embodiments, the sacrificial layer may be an organic spin-on material such as, for example, commonly used polymer resist materials for lithography (e.g. PMMA (poly-methyl methacrylate)) or an organic low-k dielectric material such as e.g. SiLk®. The thickness of the sacrificial layer depends on the application and on the size, more particularly height, of the three-dimensional structure to be formed, and may, for example, be in the range of between 10 nm and 10 µm.

Figure 1B:
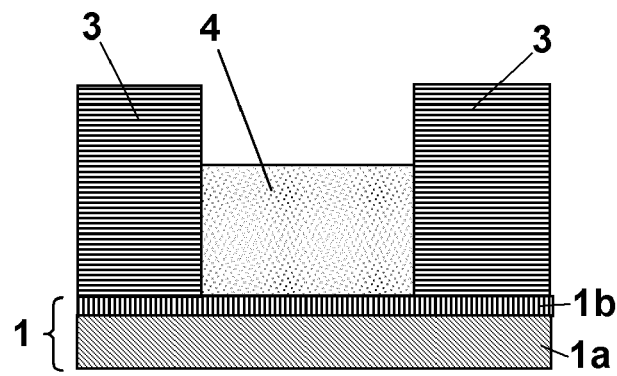

After forming openings 2 in the sacrificial layer the substrate 1 may be immersed in an electrolytic bath to perform electrochemical co-deposition of a catalytic material and a non-catalytic material. This may, for example be done by ECD or alternatively by electroless deposition. During the co-deposition process, the openings 2 are filled with a non-catalytic material 5 acting as matrix with embedded therein catalytic material. FIG. 1B illustrates the openings 2 which are filled with a co-deposit 4 of a non-catalytic material matrix having co-deposited catalytic material embedded therein. According to preferred embodiments, and as illustrated in FIG. 1B, the openings 2 in the sacrificial layer may be partly filled. According to other preferred embodiments, the openings 2 may also be completely filled.

The non-catalytic and/or catalytic material may comprise a conductive material. Preferably, the non-catalytic and/or catalytic material comprises a metal. As known by a person skilled in the art, electrochemical co-deposition of a first, non-catalytic material, e.g. metal, and a second, catalytic material, e.g. metal, having standard potentials that are far apart can lead to a large difference in deposition rates of the two materials, e.g. metals. In the case of a regular system, the catalytic and non-catalytic materials being metals, this would mean that a more noble metal would be deposited preferentially at low overpotentials. The co-deposition process may be performed at a potential suitable for depositing the non-catalytic material, e.g. metal, for the matrix. As the standard potential of the second, catalytic material, e.g. metal, may be far away from the potential at which deposition is performed, the deposition circumstances are not favourable for deposition of this second, catalytic material, e.g. metal, and thus only very small amounts of this catalytic material, e.g. metal, are deposited together with the first, non-catalytic material, e.g. metal. Details of co-deposition processes are described in "Electrochemical and Materials Science Aspects of Alloy Deposition", D. Landolt, Electrochimica Acta, Vol. 39, 1075-1090, 1994 and in A. Brenner, "Electrodeposition of alloys", Academic Press, new York, 1963.

Parameters of the co-deposition process such as bath composition and/or deposition potential may be tuned so that the amount of second, catalytic material that is deposited together with the matrix is such that it forms particles with a diameter of, for example, smaller than 5 nm, e.g. between 4 and 5 nm when single wall carbon nanotubes have to formed, with a diameter of between 5 nm and 30 nm when multi-wall carbon nanotubes have to be formed and with a diameter of larger than 30 nm when nanowires have to be formed. This makes them suitable to be used as catalytic nanoparticles, from which for example elongated nanostructures may be grown.

The non-catalytic matrix with embedded catalytic material made by co-deposition from an electrolyte solution with both the matrix and catalyst materials present as metal ions, may also be referred to as an alloy. The alloy composition can be controlled by adjusting the bath composition (e.g. by changing the metal ion concentration), by adding complexing agents to bring the standard potentials closer together, and/or by using different deposition parameters (potential or current). By, for example, bringing the standard potentials closer together a better control of the deposition process, i.e. of the deposition rate, can be obtained and thus a better control of the composition of the deposited alloy can be obtained.

Alternatively, the non-catalytic matrix with embedded catalytic material may be made by particle co-deposition from a solution that contains the matrix as metal ions and the catalyst material as nanoparticles. Hence, according to these embodiments, catalytic particles may be dispersed as metallic nanoparticles in solution and the matrix may be deposited from dissolved metal ions in the solution. For example, a suitable solution to be used with the present embodiment may be Co nanoparticles in a cupric sulphate solution. The resulting co-deposit may in this case be referred to as composite. The composite composition or packing can be controlled by adjusting the bath composition from which the co-deposit is deposited, for example by changing the metal ion concentration, the volume fraction of the catalyst nanoparticles and/or the initial nanoparticle size. Details of particle co-deposition processes to form composites may be found in "Kinetics of particle co-deposition of nanocomposites", I. Shao et al., J. Electrochem. Soc. 149, C610, 2002.

FIG. 2 illustrates some of the combinations of materials that are suitable to form binary and ternary alloys. These alloys can be taken into account to perform co-deposition of catalytic material embedded in a non-catalytic matrix by using electrodeposition (D. Landolt et al. "Electrochemical and Materials Science Aspects of Alloy Deposition", Electrochimica Acta, Vol. 39, No. 8/9, 1075-1090, 1994). Black areas indicate alloys of particular importance. The crosses indicate other suitable alloys. The chemical components indicate a third alloy element added to form ternary alloys. Ternary alloys may, according to preferred embodiments, comprise two catalytic and one non-catalytic material or may, according to other embodiments comprise one catalytic and two non-catalytic materials.

According to preferred embodiments, the non-catalytic material to form the matrix may, for example, be copper, and the catalytic material may be cobalt, nickel, Iron, or any other suitable material which is able to initiate growth of elongated nanostructures, e.g. nanowires. A suitable combination which may be used with the method according to preferred embodiments may, for example, be a copper matrix with embedded therein cobalt nanoparticles.

Figure 1C:
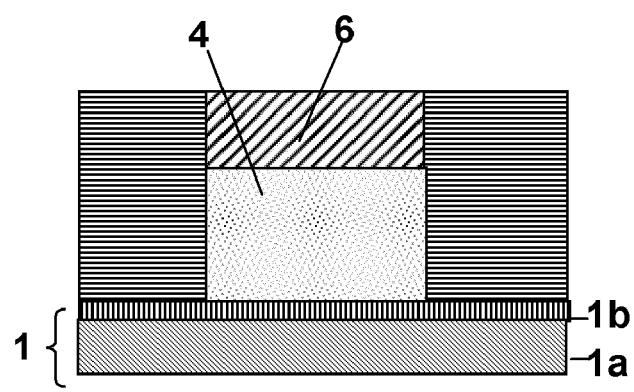

In a next step of a method according to preferred embodiments, which is illustrated in FIG. 1C, a capping layer 6 may be provided, e.g. deposited on top of the co-deposited material 4. The capping layer 6 may, according to preferred embodiments, be for preventing growth of elongated nanostructures on top of the three-dimensional structure. However, when, according to other preferred embodiments, the growth of elongated nanostructures on top of the three-dimensional structure is desired as well, no capping layer 6 has to be provided. In particular embodiments, the thickness of the capping layer 6 may be in the range of a few nanometers up to several tens of nanometers. The capping layer 6 may be deposited by using electrochemical deposition (ECD) or, alternatively, by using electroless deposition. The deposition of the capping layer 6 may be performed from the same electrolytic bath as the bath that is used for the provision of the co-deposit 4 (catalytic+non-catalytic material) for filling the openings 2 in the sacrificial layer, e.g. by adjusting the deposition potential, or, alternatively, may be deposited from a separate electrolytic bath. Alternatively, the capping layer 6 is deposited using sputter techniques such as Physical Vapor Deposition (PVD) or other deposition techniques such as Atomic Layer Deposition (ALD) or Chemical Vapor Deposition (CVD). In the latter cases, the material of the capping layer 6 may be deposited everywhere, including on the sacrificial pattern 3 and will have to be selectively removed by, for example, lift-off techniques, such that the capping layer 6 only remains on top of the co-deposit 4 in the openings 2 of the sacrificial pattern 3. The capping layer 6 may comprise one layer of material but may, alternatively, also comprise any number of layers.

According to preferred embodiments, the capping layer 6 may comprise any suitable non-catalytic material that can be deposited by using ECD or electroless plating as long as it prevents the growth of elongated nanostructures on top of the three-dimensional structure. The material of the capping layer 6 may furthermore be such that it does not allow easy diffusion of the catalytic material from the non-catalytic matrix to the capping layer 6. According to preferred embodiments, the capping layer 6 may be formed of the same non-catalytic material as the material used to form the non-catalytic matrix. According to other preferred embodiments, the capping layer 6 may be formed of a non-catalytic material that differs from the material used to form the non-catalytic matrix. For example, the non-catalytic material of the capping layer 6 may be molybdenum and the material of the non-catalytic matrix may be copper. According to other preferred embodiments, the capping layer 6 may be formed by a layer comprising copper. The non-catalytic matrix may comprise copper as well.

Figure 1D:
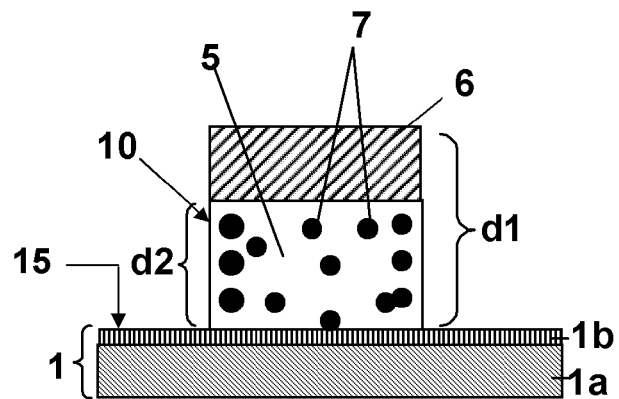

Parameters of the co-deposition process may be tuned such that the catalytic material forms catalyst nanoparticles 7 in the non-catalytic matrix 5 with a diameter of, for example, below 5 nm, e.g. between 1 and 5 nm when single wall carbon nanotubes have to formed, with a diameter of between 5 nm and 30 nm when multi-wall carbon nanotubes or nanowires have to be formed and with a diameter of larger than 30 nm when carbon nanofibers or nanowires have to be formed. However, according to preferred embodiments and as illustrated in FIGS. 1C and 1D, a co-deposit 4 may be formed which does not yet comprise suitable catalyst nanoparticles 7 for, for example, growing elongated nanostructures (see FIG. 1C). For example, the particles may have diameters which are too small or too large. In this case an anneal step may be required such that catalytic material present in the co-deposit 4 is transformed into suitable catalytic nanoparticles 7 which are embedded in the non-catalytic matrix 5 (see FIG. 1D). The anneal step may be performed before or after provision of the capping layer 6.

According to preferred embodiments, annealing may be performed by, for example, a Rapid Thermal Anneal (RTA) at a temperature in the range of between 350° C. and 900° C., preferably below 600° C. According to embodiments, annealing may be performed before the capping layer 6 is provided. In that case, the temperature at which annealing is performed may depend on the thickness $d_2$ (indicated in FIG. 1D) of the co-deposit 4. The thickness $d_2$ as well as the temperature and time duration of the annealing step may have an influence on the size and more particularly the diameter of the nanoparticles 7 formed. Also the concentration of the catalytic material and the properties of non-catalytic matrix itself may have an effect on the resulting nanoparticle size. Annealing may be performed for a time period of at least 10 seconds up to a few minutes. Annealing may be performed under an inert ($N_2$ or Ar) or reducing (containing $H_2$ or $NH_3$) atmosphere.

According to preferred embodiments and depending on the nature of the capping layer 6, the annealing step may also be performed after the step of depositing a capping layer 6. In that case, the thickness of the structure (=co-deposit 4+capping layer 6) $d_1$ (indicated in FIG. 1D) as well as the temperature and time duration of the annealing step may have an influence on controlling the size and more particularly the diameter of the nanoparticles 7.

In a next step, the sacrificial pattern 3 may be removed to expose sidewalls 10 of the non-catalytic matrix 5 to form the three-dimensional structure. The sidewalls 10 of the three-dimensional structure are, when a main surface 15 of the substrate 1 is lying in a plane, lying in a plane which is substantially perpendicular to the plane of the main surface 15 of the substrate 1. By removing the sacrificial pattern 3 parts of the main surface 15 of the substrate 1, in the example given formed by the seed layer 1b, may be exposed. Therefore, according to preferred embodiments, the method may furthermore comprise removing the exposed parts of the seed layer 1b, or in other words, parts of the seed layer 1b which are not covered by the three-dimensional structure. This may for example be done by a selective etch as known by a person skilled in the art. For example, in case the seed layer 1b comprises a WCN layer (and the matrix is Cu), the selective etch may be a wet etch using an etch solution which may comprise 3M NaOH (or KOH) and 1 g/l BTA (benzotriazole).

According to alternative preferred embodiments the step of removing the sacrificial pattern 3 may be performed before the step of performing an anneal step to transform the catalytic material present in the co-deposit 4 into suitable catalytic nanoparticles 7 which are embedded in the non-catalytic matrix 5.

Figure 1E:
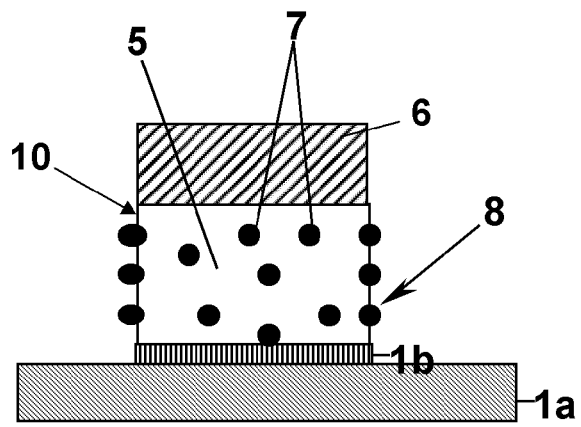

After the steps of depositing a capping layer 6, performing an anneal step and removing the sacrificial pattern 3 (performed in any order), part of the non-catalytic material 5 at the sidewalls 10 of the three-dimensional structure is selectively removed, for example by selective wet or dry etching, to expose at least part of at least one catalytic nanoparticle 7. For example, in case the non-catalytic material matrix 5 comprises copper and the catalytic nanoparticles 7 embedded in the matrix 5 comprise cobalt, copper at the sidewalls 10 of the three-dimensional structure may be removed by using an etch solution comprising an $NH_4OH/H_2O_2$ etchant and may, for example, be performed by using a solution comprising 25 mL $NH_4OH$, 25 mL $H_2O$ and 50 mL 30% $H_2O_2$. Another suitable etchant to remove copper from the sidewalls 11 of the three-dimensional structure may be a solution of 2 vol. % $HNO_3$ in water. FIG. 1E illustrates the three-dimensional structure having catalytic nanoparticles 8 exposed on its sidewalls 10.

Optionally an additional cleaning step, such as e.g. a wet cleaning step, may be performed to remove impurities which may be present on the exposed catalytic nanoparticles 8. These impurities may be residues from processes used to, for example, remove the sacrificial layer or to remove part of the non-catalytic material. In that way substantially impurity-free catalytic nanoparticles 8 may be obtained at the sidewalls 10 of the three-dimensional structures, which may then advantageously be used as a catalyst for, for example, growth of elongated nanostructures onto the sidewalls 10.

The required diameter of the catalytic nanoparticles 8 to be formed may depend on the application. The catalyst nanoparticles 8 formed by the method according to preferred embodiments may have a diameter of smaller than 100 nm. According to specific embodiments, where, for example, single wall CNTs have to be formed using the catalyst nanoparticles 8, these nanoparticles 8 may have a diameter smaller than 5 nm, for example in the range between 1 nm and 5 nm. According to other specific embodiments, where multiwall CNTs have to be formed using the catalyst nanoparticles 8, these nanoparticles 8 may have a diameter larger than 5 nm and preferably in the range of between 5 nm and 30 nm.

According to alternative embodiments removing exposed parts of the seed layer 1b may be performed after removing part of the non-catalytic material 5 on the sidewalls 10 of the three-dimensional structure to expose the catalytic nanoparticles 8. Alternatively, the steps of removing exposed parts of the seed layer 1b and removing part of the non-catalytic material 5 on the sidewalls 10 may be performed simultaneously; for example with a same etch chemistry, i.e. by using a same etch solution.

Figure 1F:
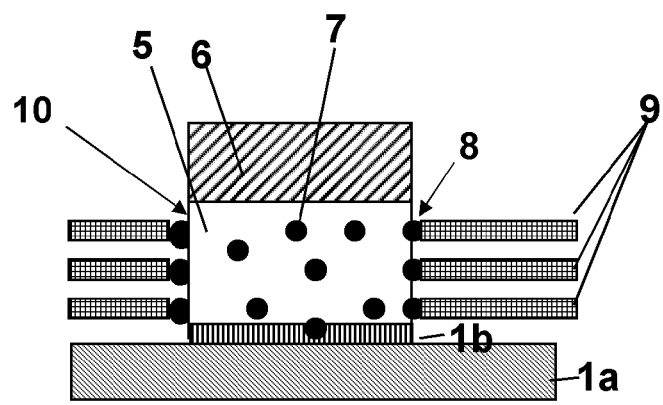
Figure 3B:
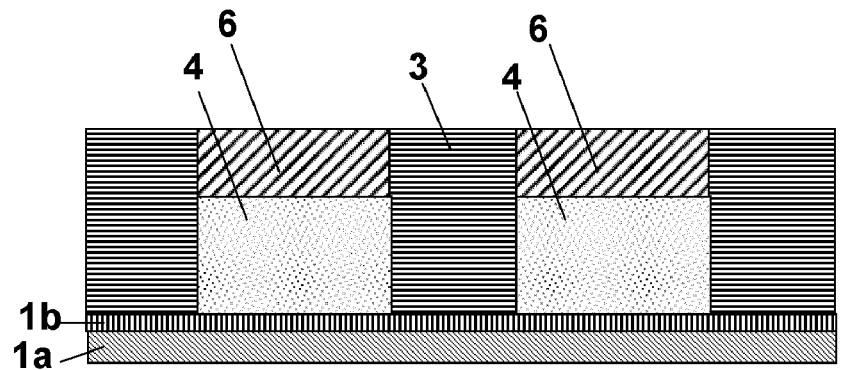
Figure 3C:
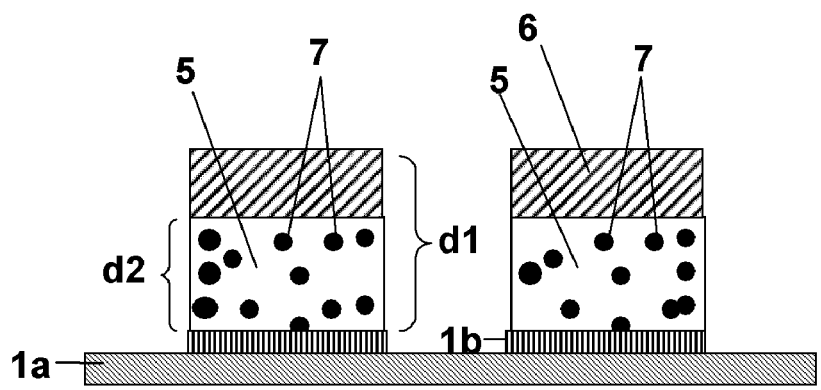
Figure 3D:
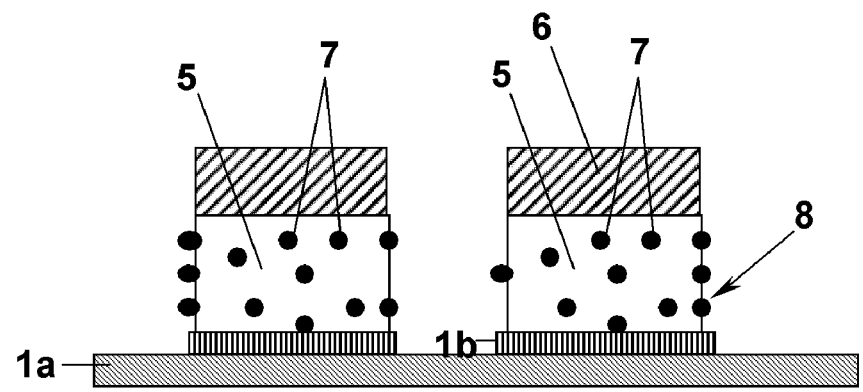
Figure 3E:
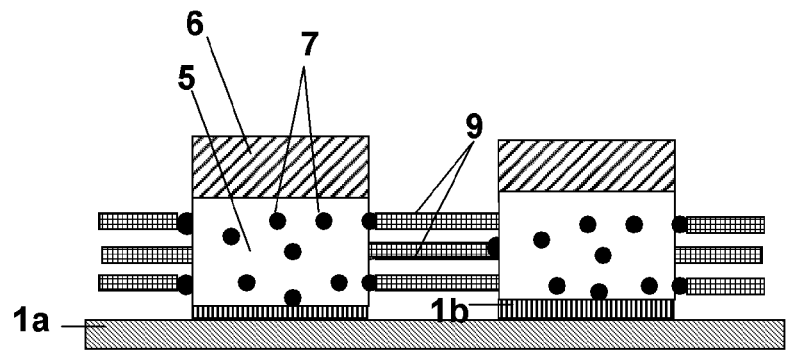

According to preferred embodiments, the exposed catalytic nanoparticles 8 formed at the sidewalls 10 of a three-dimensional structure may advantageously be used for growing elongated nanostructures 9 such as CNTs or NWs lying in a plane substantially parallel to plane of the main surface 15 of the substrate 1 as illustrated in FIG. 1F.

Therefore, according to preferred embodiments a method is provided for forming elongated nanostructures 9 using the exposed catalytic nanoparticles 8 on the sidewalls 10 of a three-dimensional structure as a catalyst. The method comprises providing catalyst nanoparticles 8 on at least one sidewall 10 of a three-dimensional structure on a substrate 1 as described hereabove and according to preferred embodiments and subsequently growing elongated nanostructures 9 using the exposed catalyst nanoparticles 8 as a catalyst, as will be explained hereafter.

An advantage of the method for forming elongated nanostructures 9 according to preferred embodiments is that it can be performed on any size of substrate. Furthermore, it is fully compatible with existing semiconductor processing, for example for manufacturing nanodevices.

Furthermore, the method for forming elongated nanostructures 9 according to preferred embodiments allows forming elongated nanostructures 9 with predetermined diameter and length and with a predetermined density. The density of the elongated nanostructures 9 formed may depend on the amount or concentration of catalytic material present in the co-deposit 4.

A further advantage of the method for forming elongated nanostructures 9 according to preferred embodiments is that it is possible to provide elongated nanostructures 9 at a predetermined location, e.g. on the sidewalls 10, of the three-dimensional structures. With predetermined locations is meant here that, when required so, elongated nanostructures 9 can be formed only on the sidewalls 10 of the three-dimensional structures and nowhere else on the three-dimensional structure. According to preferred embodiments, the elongated nanostructures 9 formed may be substantially parallel elongated nanostructures 9. With substantially parallel elongated nanostructures 9 is meant that, when the elongated nanostructures 9 have a longitudinal axis, the longitudinal axis of the elongated nanostructures 9 are lying in substantially parallel planes. Furthermore, the longitudinal axis of the elongated nanostructures 9 formed may be lying in a plane substantially parallel to the plane of the main surface 15 of the substrate 1 the three-dimensional structures are formed on.

FIG. 1F illustrates the growth of parallel elongated nanostructures 9 using as a catalyst the exposed nanoparticles 8 formed at the sidewall 10 of a three-dimensional structure according to preferred embodiments. This may be done by exposing the nanoparticles 8 to proper synthesis conditions by using suitable techniques known by a person skilled in the art such as, for example, chemical vapor deposition (CVD), Vapor Liquid Solid (VLS) or Vapor Solid Solid (VSS) techniques.

According to specific preferred embodiments, growing elongated nanostructures may comprise growing carbon nanotubes (CNTs). In this case, growing the CNTs may comprise providing a carbon source and a carrier gas, and heating the substrate 1.

According to preferred embodiments the CNTs 9 may be grown by Chemical Vapor Deposition (CVD) or Plasma Enhanced-CVD (PE-CVD). These methods use a carbon source such as e.g. $CH_4$, $C_2H_4$ and $C_2H_2$ and gases such as $N_2$ and/or $H_2$ as assistant gases. For example, growing CNTs 9 may be performed by using $CH_4$ as a carbon source and gases such as $N_2$ and/or $H_2$ as assistant gases and may be performed at growth temperatures lower than 900° C.

According to other embodiments, other carbon sources may be used, such as $C_2H_4$, and other growth temperatures may be required. For example, the growth temperature may be lower than 450° C. to avoid damage to material of the substrate 1 on which the CNTs, or in general the elongated nanostructures 9, are grown. For example, using other carbon sources such as $C_2H_2$, growth temperatures lower than 500° C. may also be suitable for growing CNTs 9, or in general the elongated nanostructures 9. In general, the diameter of the formed CNTs, or in general the elongated nanostructures 9 may be consistent with, i.e. may be substantially the same as, the diameter of the original catalyst nanoparticles 8 from which growth was started. With decreasing nanoparticle sizes, the diameter of the CNTs, or in general the elongated nanostructures 9 may become smaller, following a one to one relation.

In general, by using the catalyst nanoparticles 8 formed by the method according to preferred embodiments for growing elongated nanostructures 9, growth may occur through base growth or through tip growth, depending on the kind of catalyst nanoparticles 8 formed.

According to preferred embodiments, the elongated nanostructures 9 may be grown in between neighbouring three-dimensional structures, i.e. they may be grown from a sidewall 10 of one three-dimensional structure to a sidewall 10 of another three-dimensional structure. FIGS. 3A to 3E illustrate a method for growing elongated nanostructures 9 parallel to a main surface of the substrate 1 from a sidewall 10 of a three-dimensional structure to an opposite sidewall of a neighbouring three-dimensional structure, according to preferred embodiments n.

The method may comprise similar process steps as described with respect to FIG. 1A to 1F. A substrate 1 is provided which may comprise a carrier 1a and a seed layer 1b for initiating ECD or electroless deposition. According to other embodiments, a substrate 1 may be provided which comprises seed layer properties for initiating ECD or electroless deposition itself. Then, a sacrificial pattern 3 is formed on the substrate 1 (see FIG. 3A) by depositing a sacrificial layer onto the substrate 1 and subsequently forming openings 2 in the sacrificial layer 3 by patterning it. This may be done similar to the process described with respect to FIG. 1A. Next, the openings 2 are filled with a co-deposit 4 comprising a non-catalytic matrix with embedded therein a catalytic material as described with respect to FIG. 1B. A capping layer 6 may then be provided on top of the co-deposit 4 (see FIG. 3B). In a next step, the patterned sacrificial layer 3 may be removed to form three-dimensional structures having sidewalls 10 which are lying in a plane substantially parallel to the plane of the main surface 15 of the substrate 1. Optionally an annealing step may be performed to form nanoparticles 7 in the non-catalytic matrix 5 (see FIG. 3C). The annealing step may be performed before or after removing the sacrificial layer 3. Then, part of the non-catalytic matrix 5 is removed at the sidewalls 10 of the three-dimensional structures, thereby exposing at least part of at least one nanoparticle 8 (see FIG. 3D). Elongated nanostructures 9 may then be grown in between neighbouring three-dimensional structures (see FIG. 3E). Elongated nanostructures 9 may be grown by using any suitable method known by a person skilled in the art as described above.

Figure 4A:
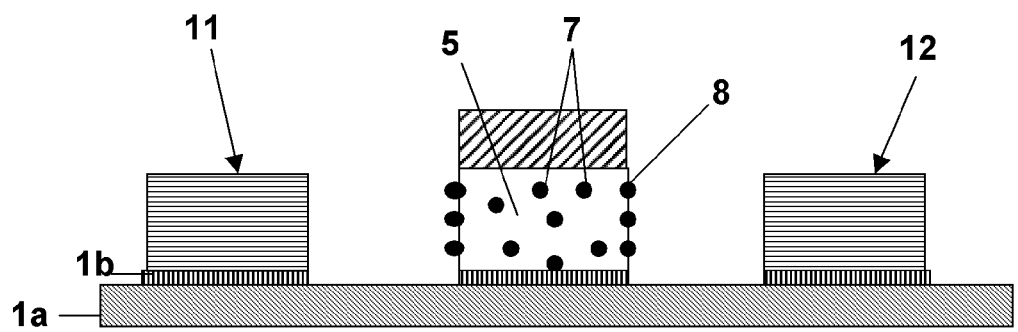
FIGS. 4A and 4B illustrate a possible application of a method according to preferred embodiments.
Figure 4B:
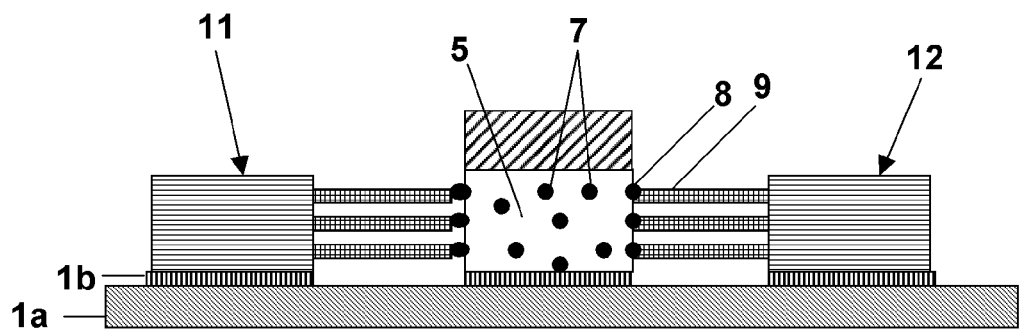

FIG. 4A and 4B illustrate a possible application for the method according to preferred embodiments. In this application, elongated nanostructures 9 such as e.g. CNTs or NWs may be grown substantially parallel to the plane of the main surface 15 of the substrate 1 from one sidewall 10 of a three-dimensional structure comprising catalyst nanoparticles 8 obtained according to preferred embodiments towards a sidewall of a "receiving" terminal 11, 12, e.g. a receiving three-dimensional structure, wherein the receiving structure is made of a different material than the three-dimensional structure the elongated nanostructures 9 are growing from and does not comprise catalyst nanoparticles 8. The receiving terminals 11, 12 may be another three-dimensional structure, a thin film, a metal, e.g. copper, line or trench. In between the receiving terminals 11, 12 and the three-dimensional structure from which the nanostructures 9 are grown, there may be a distance of between 1 μm and 10 μm or between 1 μm and 100 μm. Additionally, according to other preferred embodiments, trench or groove structures (not shown in the figures) may be provided at the sidewalls 10 of the three-dimensional structures to "guide" the growing CNTs from a nanoparticle 8 towards the receiving terminals 11 and 12. One possible approach for the fabrication of the receiving three-dimensional structures 11, 12 could be to apply a double lithographic step, where a through-mask deposition of the receiving terminals 11, 12 is performed first. Processing of a three-dimensional structure having catalytic nanoparticles 8 exposed at the sidewalls 10 may be performed according to preferred embodiments as described above (see FIG. 4A).

Elongated nanostructures 9 may then be grown in between the three-dimensional structure and the receiving terminals 11, 12 by a method as known by a person skilled in the art and as described above, thereby using the exposed catalyst nanoparticles 8 at the sidewalls 10 of the three-dimensional structure as a catalyst.

The method according to preferred embodiments for growing parallel nanostructures 9 based on the method for forming at least one catalytic nanoparticle 8 at at least one sidewall 10 of a three-dimensional structure according to preferred embodiments can, for example, be used in the manufacturing process of semiconductor devices. For example, the methods according to preferred embodiments can be used to form interconnects in semiconductor devices.

It is to be understood that although preferred embodiments, specific constructions and configurations, as well as materials, have been discussed herein for devices according to preferred embodiments, various changes or modifications in form and detail may be made without departing from the scope of this invention as defined by the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

What is claimed is:

1. A method for providing at least one catalyst nanoparticle on at least one sidewall of a three-dimensional structure on a main surface of a substrate, the method comprising:
   selectively removing at least part of a non-catalytic matrix at at least one sidewall of a three-dimensional structure on a main surface of a substrate, wherein the three-dimensional structure comprises catalyst nanoparticles embedded in the non-catalytic matrix, wherein the main surface lies in a plane, and wherein at least one sidewall of the three-dimensional structure lies in a plane substantially perpendicular to the plane of the main surface of the substrate, whereby at least one catalyst nanoparticle is exposed.

2. The method according to claim 1, wherein the three-dimensional structure is formed by the steps of:
   providing a sacrificial pattern on the main surface of the substrate, the sacrificial pattern comprising at least one opening;
   filling the opening with a material comprising a non-catalytic matrix with catalyst nanoparticles embedded therein; and
   removing the sacrificial pattern, whereby the three-dimensional structure is formed.

3. The method according to claim 2, wherein the step of filling the opening with a material comprising a non-catalytic matrix with catalyst nanoparticles embedded therein comprises:
   filling the opening with a material comprising a non-catalytic matrix with a catalyst material embedded therein; and
   performing an annealing step whereby the catalyst nanoparticles are formed.

4. The method according to claim 3, wherein the annealing step is performed by a rapid thermal anneal at a temperature of from about 350° C. to about 900° C.

5. The method according to claim 2, wherein filling the opening with a material comprising a non-catalytic matrix with embedded therein a catalytic material is performed by a co-deposition technique.

6. The method according to claim 5, wherein the step of filling the opening with a material comprising a non-catalytic matrix with catalyst nanoparticles embedded therein is performed by at least one of electrochemical deposition and electroless deposition.

7. The method according to claim 2, wherein providing a sacrificial pattern comprises:
providing a layer of sacrificial material on the main surface of the substrate; and
forming at least one opening in the layer of sacrificial material according to a predetermined pattern, thereby exposing a part of the main surface of the substrate.

8. The method according to claim 7, wherein providing a layer of sacrificial material is performed by providing a layer of organic material.

9. The method according to claim 7, wherein forming at least one opening is performed by patterning the sacrificial layer using photolithography and an anisotropic dry etch process to transfer the predetermined pattern to the sacrificial layer.

10. The method according to claim 1, further comprising a step of:
providing a capping layer on top of the non-catalytic matrix before selectively removing at least part of the non-catalytic matrix at at least one sidewall of the three-dimensional structure.

11. The method according to claim 2, wherein the substrate comprises a carrier and a seed layer for initiating at least one of electrochemical deposition and electroless deposition.

12. The method according to claim 11, wherein the carrier is a semiconductor wafer.

13. The method according to claim 11, wherein the seed layer is a continuous layer or discontinuous layer, and wherein the seed layer comprises at least one of WCN and Cu.

14. The method according to claim 11, wherein the seed layer is a continuous layer or discontinuous layer, and wherein the seed layer comprises at least one of Pd particles, Pt particles, and Ru particles.

15. The method according to claim 11, further comprising, after removing the sacrificial pattern, a step of removing exposed parts of the seed layer.

16. A method for forming at least one elongated nanostructure on at least one sidewall of a three-dimensional structure on a main surface of a substrate, the method comprising:
selectively removing at least part of a non-catalytic matrix at at least one sidewall of a three-dimensional structure on a main surface of a substrate, wherein the three-dimensional structure comprises catalyst nanoparticles embedded in a non-catalytic matrix, wherein the main surface lies in a plane, and wherein the sidewall of the three-dimensional structure lies in a plane substantially perpendicular to the plane of the main surface of the substrate, whereby at least one catalyst nanoparticle is exposed; and
growing at least one elongated nanostructure using the exposed catalyst nanoparticle as a catalyst.

17. The method according to claim 16, wherein the elongated nanostructure lies in a plane substantially parallel to the plane of the main surface of the substrate.

18. The method according to claim 16, wherein growing at least one elongated nanostructure is performed by chemical vapor deposition, a vapor liquid solid technique, and a vapor solid solid technique.

19. The method according to claim 16, further comprising:
providing a capping layer on top of the non-catalytic matrix before selectively removing at least part of the non-catalytic matrix at at least one sidewall of the three-dimensional structure.

20. Use of the method according to claim 1 in a process for manufacturing a semiconductor device.

21. Use of the method according to claim 16 in a process for forming interconnects in a semiconductor device.

* * * * *